(12) United States Patent
Ahr et al.

(10) Patent No.: US 6,224,388 B1
(45) Date of Patent: May 1, 2001

(54) IN-BOARD CONNECTOR

(75) Inventors: Sean M. Ahr, Raleigh; Thomas D. Snyder, Cary, both of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/455,183

(22) Filed: Dec. 6, 1999

(51) Int. Cl.⁷ .................................................. H01R 12/00
(52) U.S. Cl. ................................ 439/55; 439/67; 439/74
(58) Field of Search .............................. 439/74, 67, 77, 439/55, 660, 931

(56) References Cited

U.S. PATENT DOCUMENTS

| | | | |
|---|---|---|---|
| 5,244,395 | * 9/1993 | DeSantis et al. | 439/67 |
| 5,397,239 | * 3/1995 | Zaderej et al. | 439/931 |
| 5,629,839 | * 5/1997 | Woychik | 439/55 |
| 5,675,888 | * 10/1997 | Owen et al. | 439/55 |

* cited by examiner

Primary Examiner—Paula Bradley
Assistant Examiner—Tho D. Ta
(74) Attorney, Agent, or Firm—Woods, Phillips, VanSanten, Clark & Mortimer

(57) ABSTRACT

A method and apparatus are provided for electrically connecting to a printed circuit board having first and second faces spaced from each other by a thickness. The connection is formed by inserting an electrical connector into a receptacle formed in the printed circuit board, and, in response to the insertion of the electrical connector, engaging a contact pad carried on the electrical connector with a contact pad carried on the printed circuit board in the receptacle between the first and second faces to urge the contact pads into electrical contact between the first and second faces.

12 Claims, 3 Drawing Sheets

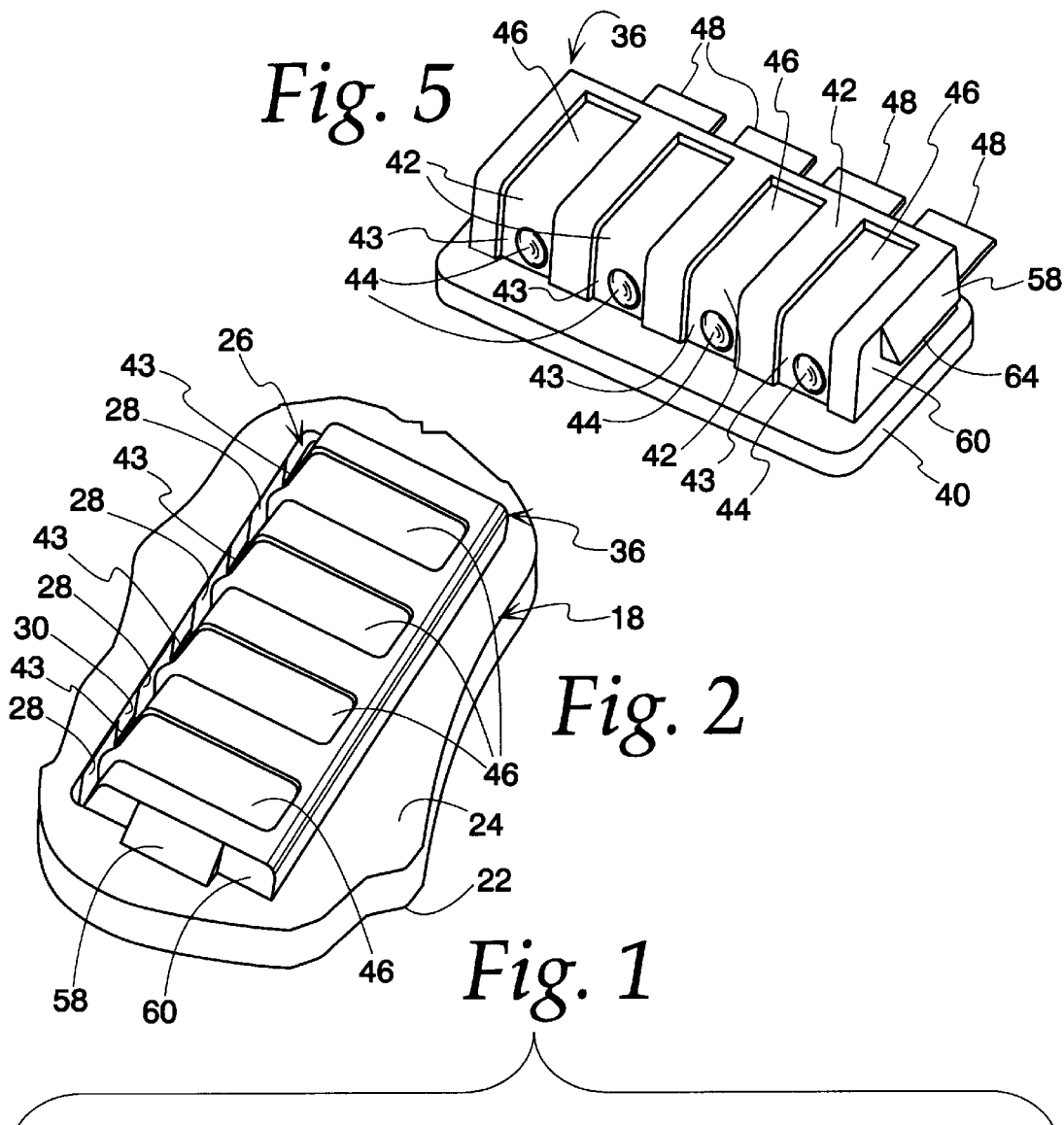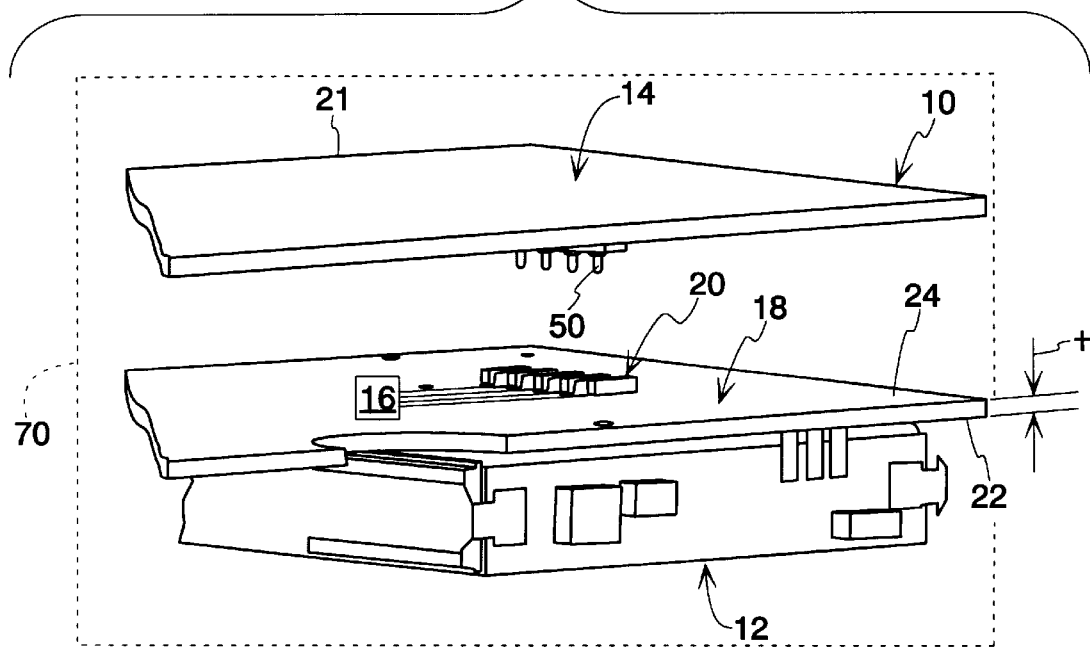

IN-BOARD CONNECTOR

BACKGROUND OF THE INVENTION

This invention relates to electrical connectors, and in particular, electrical connectors for use with printed circuit boards.

The height or thickness of electronic components continues to be reduced. This allows for thinner electronic assemblies on products because the thickness of a product is typically dictated by the largest components on a circuit board. Because of the miniaturization of other electronic components, the largest components on a circuit board are often the electrical connectors. Accordingly, there is a continuing need to miniaturize electrical connectors.

SUMMARY OF THE INVENTION

In accordance with one feature of the present invention, a printed circuit board includes first and second faces spaced from each other by a thickness of the printed circuit board, a circuit on at least one of the first and second faces, a first edge surface extending from the first face towards the second face and bounding a receptacle into which an electrical connector can be inserted, and a conductor applied to the first edge surface to define a contact pad electrically connected to the circuit on the at least one of the first and second faces, the contact pad positioned to make electrical contact at a location between the first and second faces with an electrical connector inserted into said receptacle to thereby electrically connect the electrical connector to the circuit on the at least one of the first and second faces.

As one feature, the contact pad comprises a conductor plated onto the first edge surface.

As one feature, the conductor is formed from a single L shaped piece that is bonded to the at least one of the first and second faces.

In accordance with one form of the invention, a printed circuit board includes first and second faces spaced from each other by a thickness of the printed circuit board, a circuit on at least one of the first and second faces, a first edge surface extending from the first face toward the second face and bounding a receptacle into which an electrical connector can be inserted, and a contact pad electrically connected to the circuit on the at least one of the first and second faces. The contact pad includes a spring element having a portion positioned between the first and second faces, spaced from the first edge surface and movable biasably toward the first edge surface by an electrical connector inserted into said receptacle which makes electrical contact with the circuit on the at least one of the first and second faces through the portion of the spring element.

In one form, the first edge surface and the receptacle extend from the first face to the second face through the printed circuit board.

In one form, the spring element includes a resilient, arcuate shaped, cantilever supported member.

In one form of the invention, an electronic assembly is provided and includes an electrical connector and a printed circuit board receiving the electrical connector. The electrical connector includes an electrically insulative body, a first contact pad carried on the body, a second contact pad carried on the body, and an electrical conductor carried on the body and arranged to electrically connect the first and second contact pads. The printed circuit board includes first and second faces spaced from each other by a thickness of the printed circuit board, a circuit on at least one of the first and second faces, a first edge surface extending from the first face toward the second face and bounding a receptacle into which the electrical connector can be inserted, and a third contact pad electronically connected to the circuit on the at least one of the first and second faces. The third contact pad is positioned to make electrical contact at a location between the first and second faces with the first contact pad with the electrical connector inserted into the receptacle. At least one of the first and third contact pads comprises a spring element positioned to deflect in response to insertion of said electrical connector into said receptacle to biasably engage the first and second contact pads into electrical contact.

In one form, the third contact pad on the printed circuit board includes a conductor plated onto the first edge surface.

In one form, the third contact pad on the printed circuit board includes the spring member in the form of a resilient, arcuate shaped, cantilever supported member.

In one form, the third contact pad on the printed circuit board is formed from a single L shaped piece that is bonded to the at least one of the first and second surfaces.

In one form, the first contact pad on the connector includes a spring member in the form of a resilient, arcuate shaped member.

As one feature of the invention, the electrical conductor and the first and second contact pads are formed from a single piece of material.

As one feature, the electrical connector further includes a fourth contact pad carried on the body and electrically connected to the first and second contact pads by the electrical conductor.

In accordance with the invention, a method is provided for electrically connecting to a printed circuit board having first and second faces spaced from each other by a thickness. The method includes the steps of inserting an electrical connector into a receptacle formed in the printed circuit board, and, in response to the insertion of the electrical connector, engaging a contact pad carried on the electrical connector with a contact pad carried on the printed circuit board in the receptacle between the first and second faces to urge the contact pads into electrical contact between the first and second faces.

In one form, the engaging step includes the step of deflecting at least one of the contact pads to biasably urge the contact pads into electrical contact between the first and second faces.

BRIEF DESCRIPTION OF THE DRAWINGS

FIG. 1 is a partially exploded perspective view of an electronic assembly including an electrical connection system embodying the present invention;

FIG. 2 is a perspective view showing the electrical connection system of FIG. 1;

FIG. 5 is a perspective view showing an electrical connector of the electrical connection system shown in FIG. 2;

FIG. 7 is a perspective view showing the printed circuit board of FIG. 6 in combination with another embodiment of

DETAILED DESCRIPTION OF THE INVENTION

Figure 4:
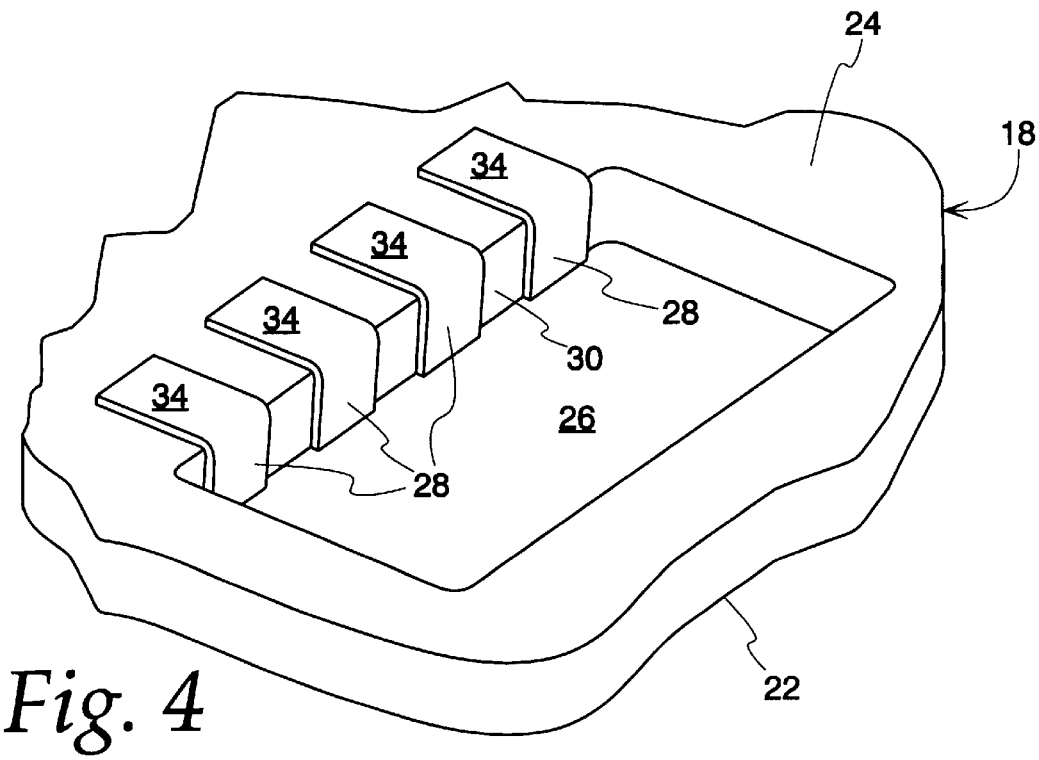
FIG. 4 is a perspective view showing another embodiment of a printed circuit board of the electrical connection system shown in FIG. 2.

With reference to FIGS. 1 and 2, exemplary embodiments of the apparatus and method according to the invention are described and illustrated herein in connection with an electronic assembly 10 including electronic components 12, 14 that are electrically connected to an electrical circuit 16 on a printed circuit board 18 via an electrical connection system 20. The electronic component 12 is provided in the form of a battery, and the electronic component 14 includes a printed circuit board 21. However, it should be understood that the invention may find utility in other applications and that no limitation to use with the specific electrical components 12, 14 shown is intended.

The printed circuit board 18 has a face 22 spaced from a face 24 by a thickness "t" of the printed circuit board 18, with the battery 12 mounted at the face 22 and the electronic component 14 mounted at the face 24.

Figure 3:
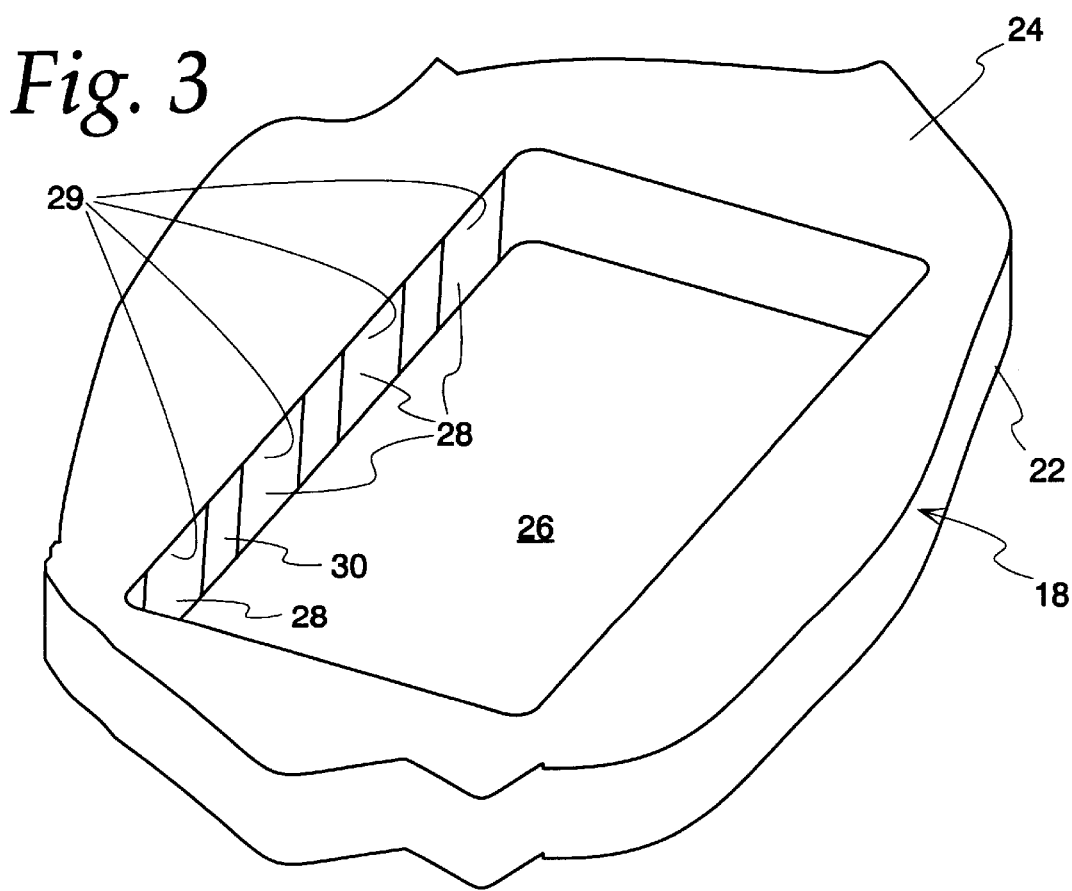
FIG. 3 is a perspective view showing one embodiment of a printed circuit board of the electrical connection system shown in FIG. 2.

As best seen in FIG. 3, in one preferred embodiment, the electrical connection system 20 includes an opening or receptacle 26 extending through the printed circuit board 18 and including one or more contact pads 28 overlying an edge surface 30 that bounds the opening 26. As best seen in FIG. 3, the contact pads 28 in one preferred embodiment of the invention are provided in the form of a conductor 29 that is plated onto the edge surface 30 using any suitable plating method. As seen in FIG. 4, in another preferred embodiment, each of the contact pads 28 is provided in the form of a single L shaped conductor element 34 that is permanently joined to the printed circuit board 18 at one of the faces 22 and 24 using any suitable bonding method. The plated conductors 29 and the conductor elements 34 may be of any material having a suitable conductivity for the particular application.

As seen in FIG. 5, the electrical connection system 20 further includes an electrical connector 36 having an electrically insulative body 40 sized for insertion into the opening 26 in the printed circuit board 18, and one or more unitary electrical conductors 42 that are carried on the body 40. In one preferred embodiment, each of the conductors 42 is formed from a single piece of material and includes a first contact pad 43 having a resilient, arcuate shaped spring element 44, a second contact pad 46, and a contact pad in the form of a tab 48. The conductors 42 can be molded into the body 40 as the body is formed, or inserted into the body 40 after the body 40 is formed. Each of the spring elements 44 extends from the body 40 in a convex shape as a protruding dimple, and the body 40 includes a suitable relief (not shown) underlying the spring element 44 to allow the spring element 44 to deflect. The spring elements 44 are positioned to contact the contact pads 28 on the printed circuit board 18 with the connector 36 inserted into the opening 26, as best seen in FIG. 2. The resulting deflection of the spring element 44 provides a contact force sufficient to maintain a suitable electrical connection with the contact pads 28. The tabs 48 can be connected with an electrical component, such as the battery 12 in FIG. 1, by any suitable means, such as soldering, welding, or mechanical fasteners. Typically, the connection with the tabs 48 will be made before the connector 36 is inserted into the receptacle 26. The contact pads 46 are exposed, flat portions of the conductor 42 that are supported from underneath by the insulative body 40. The contact pads 46 are arranged to contact an electrical component associated with the printed circuit board 18, such as through the pogo-pins or spring contacts 50 of the printed circuit board 21 in FIG. 1. The connection with the to contact pads 46 will typically be made either during or after insertion of the connector 36 into the receptacle 26.

Figure 6:
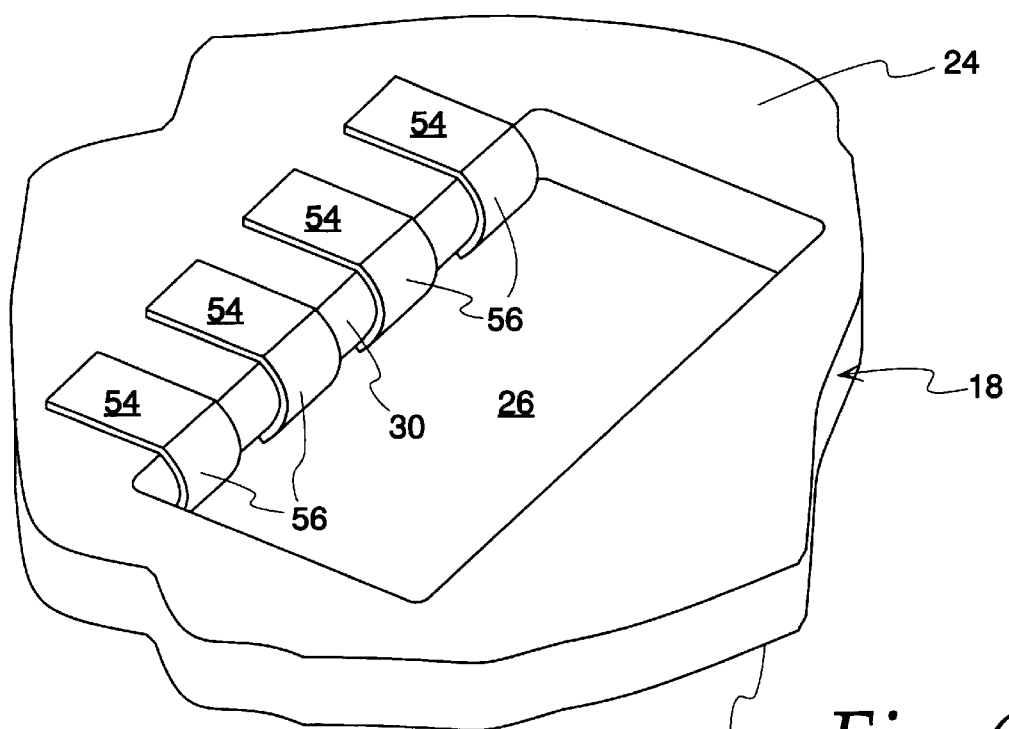
FIG. 6 is a perspective view showing yet another embodiment of a printed circuit board of the electrical connection system shown in FIG. 2.
Figure 7:
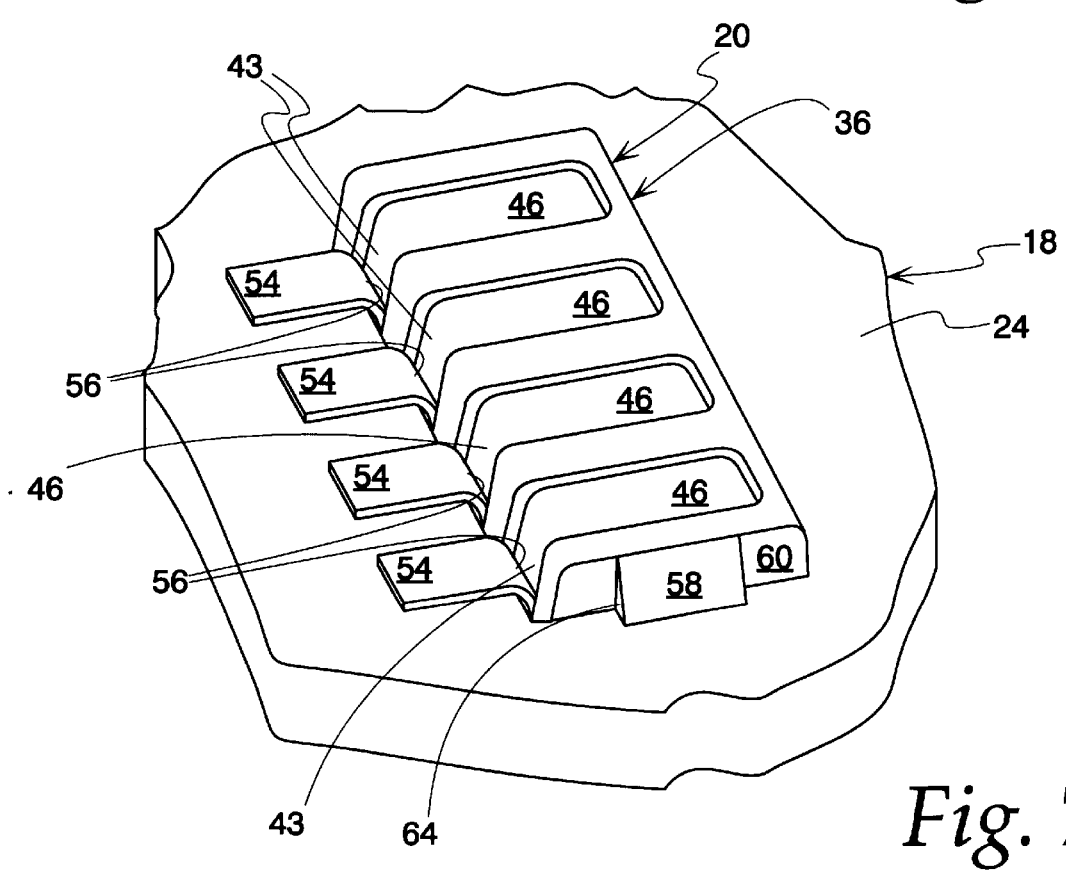

FIGS. 6 and 7 illustrate another preferred embodiment for the electrical connection system 20. In this embodiment, the contact pads 28 are provided in the form of conductive elements 54 that are mounted on the printed circuit board 18, each including an arcuate shaped, resilient spring element 56 overlying the edge surface 30. Each of the conductive elements 54 is formed from a single piece of material. The contact pads 43 on the connector 36 are exposed, flat portions of the conductor 42. When the connector 36 is inserted into the opening 26, the spring elements 56 deflect while engaging the contact pads 43 to provide a suitable contact force to maintain an electrical connection. The conductive elements 54 may be of any material having a suitable conductivity for the particular application, and that is resilient enough to provide an appropriate spring force for the spring element 56.

As best seen in FIGS. 2 and 7, the insulative body 40 includes a pair of snap wedges 58 (only one shown) formed on opposite sides 60 and 62 of the body 40, each having a shoulder 64 that engages the printed circuit board 18 to resist removal of the connector 36 from the opening 26. The angled surface of the snap wedges 58 allows the snap wedges 58 to be inserted into the opening 26.

Thus, a method of electrically connecting to a printed circuit board is provided wherein, in response to the insertion of the electrical connector 36 into the receptacle 26, the contact pads 28 are engaged with the contact pads 43 to urge the contact pads 28 and 43 into electrical contact with each other between the first and second faces 22 and 24. With the connector 36 inserted into the opening 26, the electrical connection system 20 shown in FIGS. 1–7 electrically connects the battery 12, the printed circuit board 21, and the circuit 16 on the printed circuit board 18. The conductor 42 may be made of any material having a suitable conductivity for the particular application, and that is resilient enough to provide an appropriate spring force for the contact 44.

While in the preferred embodiments shown in FIGS. 1–7, the conductor 42 includes the contact pad 43, the contact pad 46 and the tab 48, any one of these elements may be eliminated from the conductor 42 when the particular application does not require that element's electrical connection. For example, the tabs 48 could be eliminated if all that is required is a connection between the circuit 16 and an electronic component 12. Similarly, the contact pads 46 could be eliminated if all that is required is a connection between the circuit 16 and an electronic component 14. By way of further example, the contact pads 43 and the pads 28 could be eliminated if all that is required is a connection between an electronic component 12 on one side of the printed circuit board 18 and an electronic component 16 on the opposite side of the printed circuit board 18.

Additionally, while in the preferred embodiments shown in FIGS. 1–7, the conductor 42 is shown as a one-piece or unitary construction, each of the elements 44, 46 and 48 could be separate pieces joined by separate conductors. Further, while in the preferred embodiments, the edge surface 30 is associated with an opening 26, in some applications, the edge surface 30 may define an outer boundary of the printed circuit board 18, or define a cutout that is open to the outer boundary of the printed circuit board 18. Additionally, in some applications, it may be desirable for the edge surface 30 to extend only partially through the printed circuit board 18 from the face 22 toward the face 24, rather than completely through the printed circuit board 18. Obviously, in such a construction, the connector 36, including the insulative body 40, can be made thinner to be compatible with the opening 26 or edge surface 30 that does not extend completely through the thickness "t" of the printed circuit board 18.

Additionally, while it is preferred for the connector 36 to include the retaining snap wedges 58, in some applications it may be desirable to eliminate the wedges 58 or to use other means of retaining the connector 38 to the printed circuit board 18.

It should be appreciated that by utilizing the thickness "t" of the printed circuit board to accommodate some of the height of the electrical connection system 20, the electrical connection system 20 allows for the overall height for an electronic assembly including a printed circuit board to be reduced in comparison to current electrical connectors for printed circuit boards.

It should further be appreciated that by allowing for a reduced size electronic assembly, the electrical connection system 20 may advantageously be employed in portable electronic devices, such as a mobile station 70 for use in a communications system, shown schematically in FIG. 1. There are many well-known forms of mobile stations 70, such as cellular telephones, in which the electrical connection system 20 may be employed, and accordingly, a detailed description of any particular mobile station need not be provided.

What is claimed is:

1. A printed circuit board for use with an electrical connector, said printed circuit board comprising:
   first and second faces spaced from each other by a thickness of the printed circuit board;
   a circuit on at least one of the first and second faces;
   a first edge surface extending from the first face toward the second face and bounding a receptacle into which an electrical connector can be inserted; and
   a contact pad electrically connected to the circuit on the at least one of the first and second faces and comprising an electrically conductive spring element, the spring element having a portion positioned between the first and second faces spaced from the first edge surface and moveable biasably toward the first edge surface by an electrical connector inserted into said receptacle which makes electrical contact with the circuit on the at least one of the first and second surfaces through the portion of the spring element.

2. The printed circuit board of claim 1 wherein said first edge surface and said receptacle extend from the first face to the second face through the printed circuit board.

3. The printed circuit board of claim 1 wherein said spring element comprises a resilient, arcuate shaped, cantilever supported member.

4. An electronic assembly comprising:
   a) an electrical connector comprising
      an electrically insulative body,
      a first contact pad carried on the body,
      a second contact pad carried on the body,
      an electrical conductor carried on the body and arranged to electrically connect said first and second contact pads; and
   b) a printed circuit board comprising
      first and second faces spaced from each other by a thickness of the printed circuit board,
      a circuit on at least one of the first and second faces;
      a first edge surface extending from the first face toward the second face and bounding a receptacle into which said electrical connector can be inserted, and
      a third contact pad electrically connected to the circuit on the at least one of the first and second faces and positioned to make electrical contact at a location between the first and second faces with the first contact pad with the electrical connector inserted into the receptacle; wherein at least one of the first and third contact pads comprises a spring element positioned to deflect in response to insertion of said electrical connector into said receptacle to biasably engage the first and third contact pads into electrical contact and the second contact pad of the connector lies in a plane that is nominally parallel to the first and second faces with the connector inserted into the receptacle.

5. The electrical assembly of claim 4 wherein said third contact pad comprises a conductor plated onto the first edge surface.

6. The electrical assembly of claim 4 wherein said third contact pad comprises said spring member in the form of a resilient, arcuate shaped, cantilever supported member.

7. The electrical assembly of claim 4 wherein said third contact pad is formed from a single L shaped piece bonded to the at least one of the first and second faces.

8. The electrical assembly of claim 4 wherein said contact pad comprises said spring member in the form of a resilient, arcuate shaped member.

9. The electrical assembly of claim 4 wherein said electrical conductor and said first and second contact pads are formed from a single piece of material.

10. The electrical assembly of claim 4 wherein said electrical connector further comprises a fourth contact pad carried on the body and electrically connected to the first and second contact pads by said electrical conductor.

11. The electrical assembly of claim 4 wherein said first edge surface and said receptacle extend from the first face to the second face through the printed circuit board and said insulative body is sized to extend through said receptacle.

12. In a mobile station, an electronic assembly comprising:
   a) an electrical connector comprising
      an electrically insulative body,
      a first contact pad carried on the body,
      a second contact pad carried on the body,
      an electrical conductor carried on the body and arranged to electrically connect said first and second contact pads; and
   b) a printed circuit board comprising
      first and second faces spaced from each other by a thickness of the printed circuit board,
      a circuit on at least one of the first and second faces;
      a first edge surface extending from the first face toward the second face and bounding a receptacle into which said electrical connector can be inserted, and
      a third contact pad electrically connected to the circuit on the at least one of the first and second faces and positioned to make electrical contact at a location between the first and second faces with the first contact pad with the electrical connector inserted into the receptacle; wherein at least one of the first and third contact pads comprises a spring element positioned to deflect in response to insertion of said electrical connector into said receptacle to biasably engage the first and third contact pads into electrical contact and the second contact pad of the connector lies in a plane that is nominally parallel to the first and second faces with the connector inserted into the receptacle.

* * * * *